United States Patent
Borthakur et al.

(10) Patent No.: US 9,324,755 B2
(45) Date of Patent: Apr. 26, 2016

(54) IMAGE SENSORS WITH REDUCED STACK HEIGHT

(71) Applicant: Semiconductor Components Industries, LLC, Phoenix, AZ (US)

(72) Inventors: Swarnal Borthakur, Boise, ID (US); Marc Sulfridge, Boise, ID (US); Mitchell J. Mooney, Star, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 166 days.

(21) Appl. No.: 14/270,233

(22) Filed: May 5, 2014

(65) Prior Publication Data

US 2015/0318323 A1    Nov. 5, 2015

(51) Int. Cl.
*H01L 27/146* (2006.01)
*H04N 5/369* (2011.01)
*H04N 9/30* (2006.01)
*H04N 5/225* (2006.01)

(52) U.S. Cl.
CPC ...... *H01L 27/14634* (2013.01); *H01L 27/1462* (2013.01); *H01L 27/1464* (2013.01); *H01L 27/1469* (2013.01); *H01L 27/14621* (2013.01); *H01L 27/14623* (2013.01); *H01L 27/14627* (2013.01); *H01L 27/14636* (2013.01); *H01L 27/14645* (2013.01); *H01L 27/14685* (2013.01); *H04N 5/2252* (2013.01); *H04N 5/369* (2013.01); *H04N 9/30* (2013.01)

(58) Field of Classification Search
CPC .................. H01L 27/14634; H01L 27/14627; H01L 27/14645; H01L 27/14636; H01L 27/1462; H01L 27/1469; H01L 27/14621; H01L 27/14685; H01L 27/1464; H01L 27/14623; H04N 5/369; H04N 9/30; H04N 5/2252

See application file for complete search history.

(56) References Cited

U.S. PATENT DOCUMENTS

| 6,221,687 B1 * | 4/2001 | Abramovich ..... H01L 27/14601 438/69 |
| 7,294,524 B2 | 11/2007 | Park |
| 7,687,305 B2 * | 3/2010 | Ryu ................. H01L 27/14627 257/432 |
| 8,247,852 B2 | 8/2012 | Tai et al. |
| 8,431,429 B2 | 4/2013 | Tai et al. |
| 8,497,536 B2 | 7/2013 | Chen et al. |

(Continued)

OTHER PUBLICATIONS

Borthakur et al., U.S. Appl. No. 14/191,965, filed Feb. 27, 2014.

(Continued)

*Primary Examiner* — Aung S Moe

(74) *Attorney, Agent, or Firm* — Treyz Law Group, P.C.; Jason Tsai

(57) ABSTRACT

An imaging system may include an image sensor die stacked on top of a digital signal processor (DSP) die. The image sensor die may be a backside illuminated image sensor die. Through-oxide vias (TOVs) may be formed in the image sensor die and may extend at least partially into in the DSP die to facilitate communications between the image sensor die and the DSP die. Bond pad structures may be formed on the surface of the image sensor die and may be coupled to off-chip circuitry via bonding wires soldered to the bad pad structures. Color filter elements may be formed over active image sensor pixels on the image sensor die. Microlens structures may be formed over the color filter elements. An anti-reflective coating (ARC) liner may be simultaneously formed over the microlens structures and over the bond pad structures to passivate the bond pad structures.

16 Claims, 5 Drawing Sheets

(56) References Cited

U.S. PATENT DOCUMENTS

| | | | |
|---|---|---|---|
| 8,536,044 B2 | 9/2013 | Li et al. | |
| 8,569,856 B2* | 10/2013 | Qian | H01L 27/14636 257/437 |
| 8,597,074 B2 | 12/2013 | Farnworth et al. | |
| 8,773,562 B1* | 7/2014 | Fan | H01L 27/14643 250/208.1 |
| 8,907,439 B1* | 12/2014 | Kay | H01L 27/14634 257/292 |
| 2005/0224946 A1* | 10/2005 | Dutta | G02B 6/12002 257/686 |
| 2005/0242408 A1* | 11/2005 | Yang | H01L 27/14618 257/428 |
| 2007/0018213 A1* | 1/2007 | Lim | H01L 27/14627 257/292 |
| 2007/0235771 A1* | 10/2007 | Liu | H01L 27/14621 257/223 |
| 2007/0284687 A1* | 12/2007 | Rantala | H01L 21/02126 257/432 |
| 2008/0043336 A1* | 2/2008 | Liao | B29D 11/00365 359/619 |
| 2008/0073736 A1* | 3/2008 | Hwang | H01L 27/1462 257/432 |
| 2008/0173792 A1* | 7/2008 | Yang | H01L 27/14618 250/208.1 |
| 2008/0293181 A1* | 11/2008 | Ryu | H01L 27/14685 438/70 |
| 2009/0034083 A1* | 2/2009 | Li | G02B 3/0031 359/619 |
| 2009/0061556 A1* | 3/2009 | Ryu | H01L 27/14621 438/70 |
| 2009/0185060 A1* | 7/2009 | Akiyama | H01L 27/14623 348/294 |
| 2009/0280596 A1* | 11/2009 | Akiyama | H01L 21/76898 438/70 |
| 2010/0200898 A1* | 8/2010 | Lin | H01L 27/14618 257/294 |
| 2010/0238331 A1* | 9/2010 | Umebayashi | H01L 27/14632 348/294 |
| 2010/0276572 A1* | 11/2010 | Iwabuchi | H01L 27/1464 250/208.1 |
| 2011/0024867 A1* | 2/2011 | Tseng | H01L 24/05 257/459 |
| 2011/0057279 A1* | 3/2011 | Lee | H01L 27/14609 257/432 |
| 2011/0155893 A1* | 6/2011 | Endo | H01L 27/14621 250/208.1 |
| 2012/0018832 A1* | 1/2012 | Cooney, III | C23C 16/02 257/432 |
| 2012/0086093 A1* | 4/2012 | Otsuka | H01L 27/14621 257/432 |
| 2013/0037902 A1* | 2/2013 | Nakazawa | H01L 27/14627 257/432 |
| 2013/0068929 A1* | 3/2013 | Solhusvik | H01L 27/14634 250/208.1 |
| 2013/0070109 A1 | 3/2013 | Gove et al. | |
| 2013/0221470 A1* | 8/2013 | Kinsman | H01L 27/14618 257/434 |
| 2013/0328151 A1* | 12/2013 | Kao | H01L 27/14636 257/443 |
| 2014/0055654 A1* | 2/2014 | Borthakur | H04N 5/335 348/302 |
| 2014/0078356 A1* | 3/2014 | Vaartstra | H01L 27/14629 348/273 |
| 2014/0145282 A1* | 5/2014 | Shen | H01L 27/1462 257/432 |
| 2014/0218572 A1* | 8/2014 | Ootsuka | H01L 27/14621 348/280 |
| 2014/0231887 A1* | 8/2014 | Chen | H01L 31/18 257/291 |
| 2014/0263959 A1* | 9/2014 | Hsu | H01L 31/18 250/208.1 |
| 2015/0303233 A1* | 10/2015 | Borthakur | H01L 27/14636 348/273 |
| 2015/0318322 A1* | 11/2015 | Borthakur | H01L 27/14632 348/294 |

OTHER PUBLICATIONS

Borthakur et al., U.S. Appl. No. 14/254,196, filed Apr. 16, 2014.

* cited by examiner

IMAGE SENSORS WITH REDUCED STACK HEIGHT

BACKGROUND

This relates generally to imaging systems, and more particularly, to imaging systems with through-oxide vias (TOVs).

Modern electronic devices such as cellular telephones, cameras, and computers often use digital image sensors. Imaging systems (i.e., image sensors) often include a two-dimensional array of image sensing pixels. Each pixel typically includes a photosensitive element such as a photodiode that receives incident photons (light) and converts the photons into electrical signals. The imaging system contains an image sensor die with an image sensor integrated circuit and an array of photodiodes. The image sensor die is mounted on a digital signal processor (DSP) die.

Circuitry within the image sensor die may be coupled to circuitry within the digital signal processor die using through-oxide vias (i.e., metal via structures formed through at least a first oxide layer in the image sensor die and through at least a second oxide layer in the DSP die). A bond pad is subsequently formed on the image sensor die. The bond pad may be coupled to the through-oxide vias. A first passivation layer is formed over the bond pad to passivate the bond pad. This passivation layer is then opened to allow wirebonding. After the passivation layer is opened an array of color filter elements is formed on the image sensor die. An array of microlenses is then formed over the array of color filter elements.

A second passivation layer is formed over the array of microlenses. This passivation layer acts as an anti-reflective coating over the microlenses. This passivation layer is subsequently opened over the bond pad to allow wirebonding. Forming image sensor dies in this way requires a large number of steps and can be costly.

It would therefore be desirable to provide improved ways of manufacturing image sensor dies.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
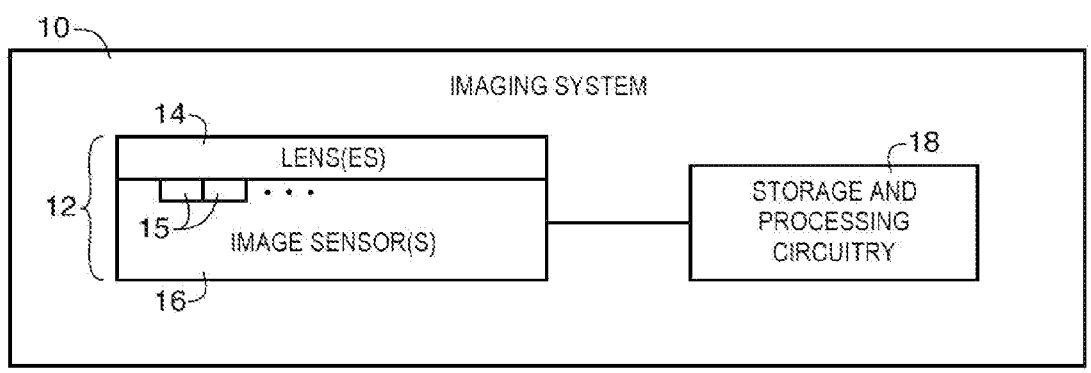
FIG. 1 is a diagram of an illustrative imaging system that may include a camera module having an image sensor in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 using lens 14. Image sensor 16 may provide corresponding digital image data to processing circuitry 18. Image sensor 16 may, for example, be a backside illumination (BSI) image sensor. If desired, camera module 12 may be provided with an array of lenses 14 and an array of corresponding image sensors 16. Image sensor 16 may include an array of image sensor pixels such as an array of image sensor pixels 15 and a corresponding array of color filter elements.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
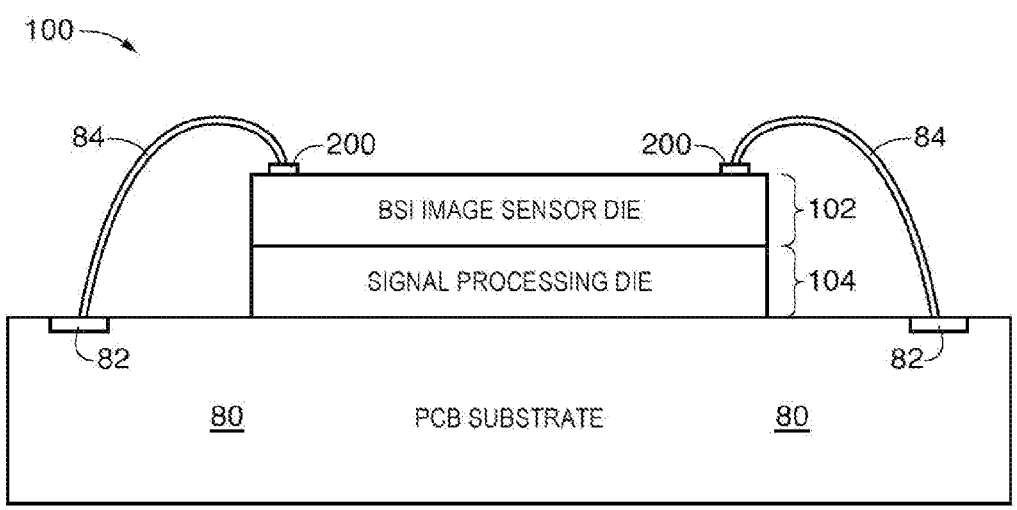
FIG. 2 is a diagram of an illustrative imaging system that includes a backside illuminated (BSI) image sensor die stacked on top of a signal processing die in accordance with an embodiment of the present invention.

FIG. 2 shows an imaging system 100 that includes an image sensor die 102 stacked on top of a signal processing die 104. Image sensor die 102 may be a backside illuminated (BSI) image sensor (as an example). Configured in this way, image sensor die 102 may include an array of image sensor pixels operable to produce image data (i.e., still or video data). Image data produced by image sensor die 102 may then be fed to signal processing die for further processing. Die 104 may sometimes be referred to as a digital signal processor (DSP). The example of FIG. 2 is merely illustrative. If desired, image sensor die 102 may be a front-side illuminated (FSI) image sensor die.

As shown in FIG. 2, the stacked dies may be mounted on a substrate such as a printed circuit board (PCB) substrate 80. Bond pads 200 may be formed on image sensor die 102. Bond pads 200 may be coupled to traces 82 or other conductive structures on PCB 80 via bond wires 84. In general, data and control signals may be conveyed between the stacked dies and other components on substrate 80 via bonding wires 84.

In conventional imaging systems, circuitry within a DSP die may communicate with circuitry within an image sensor die that is stacked on top of the DSP die using through-oxide vias. Through-oxide vias are formed in a first processing step.

Light shielding structures are then formed over the through-oxide vias in a second processing step after the first processing step. Bond pad and a passivation layer over the bond pad are then formed in a third processing step. Color filter elements and microlens structures are then formed over corresponding image sensor pixels in the image sensor in a fourth processing step after the third processing step. Forming image sensor structures in this way requires many processing steps and can be inefficient and costly.

Figure 3:
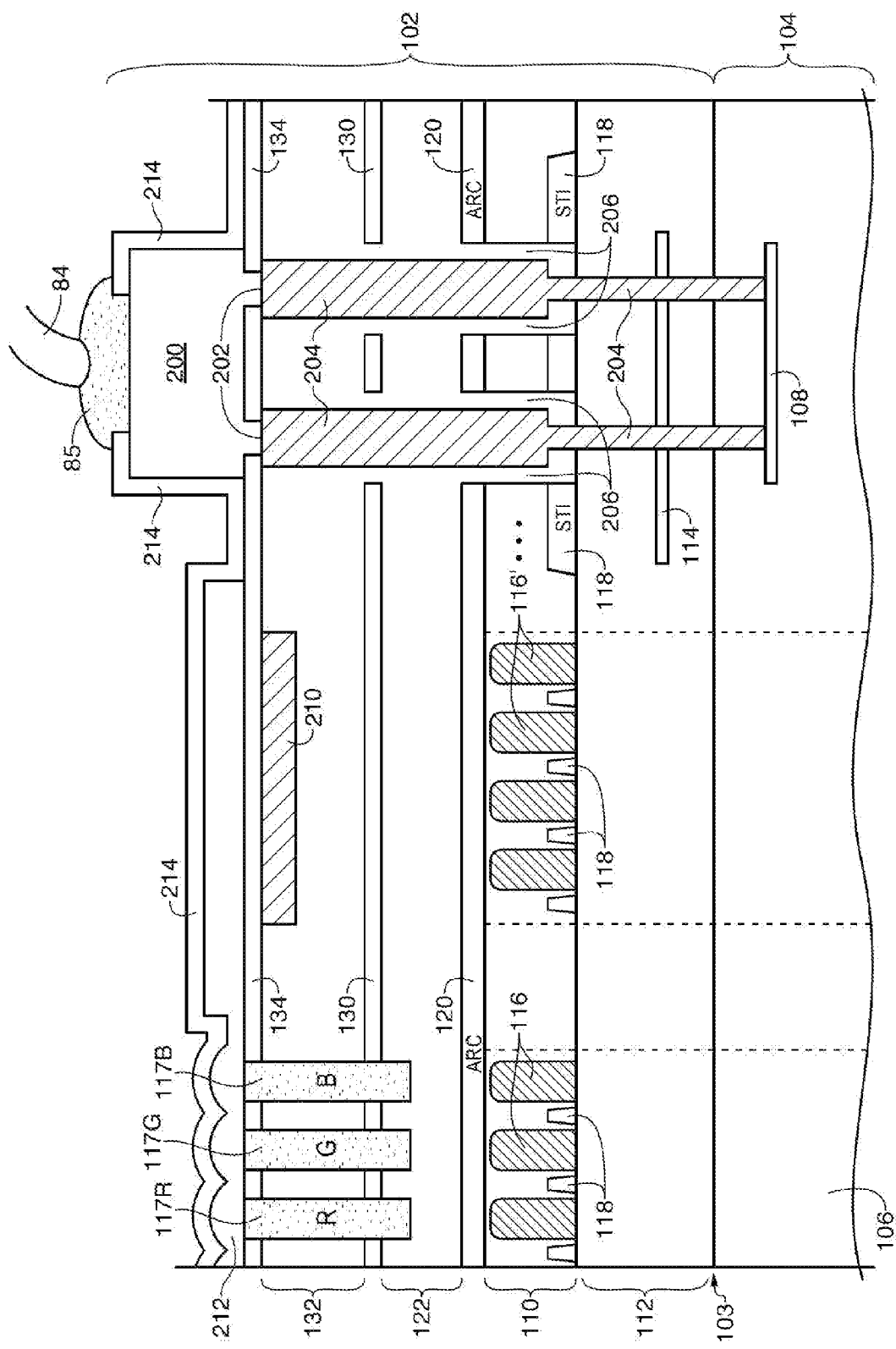
FIG. 3 is a cross-sectional side view of an illustrative imaging system having microlens structures and external bond pad structures on which a common passivation layer is formed in accordance with an embodiment of the present invention.

In accordance with an embodiment of the present invention, an image sensor die is provided that can be formed using a reduced number of steps. FIG. 3 is a cross-sectional side view of image sensor die 102 that is stacked on top of signal processing die 104. The interface at which dies 102 and 104 are stacked is marked by arrow 103.

As shown in FIG. 3, image sensor die 102 may include a substrate 110 having a front surface and a back surface and interconnect routing layers 112 formed on the front surface of substrate 110. Layers 112 may include alternating metal routing layers and via layers (e.g., routing structures formed in dielectric material) and may sometimes be referred to collectively as a dielectric stack or redistribution layers.

Photosensitive elements such as photodiodes 116 may be formed at the front surface of substrate 110. Photodiodes 116 that are formed in an "active" portion of image sensor die 102 may receive incoming light and convert the incoming light into corresponding pixel signals, whereas photodiodes 116' that are formed in a peripheral portion of image sensor 102 may not receive any incoming light and may serve as reference photodiodes for noise canceling purposes (as an example). Shallow trench isolation (STI) structures such as STI structures 118 may be formed in the front surface of substrate 110 between each adjacent pair of photodiodes. STI structures 118 may serve to ensure that neighboring photodiodes are electrically isolated from one another.

An antireflective coating (ARC) layer such as ARC layer 120 may be formed at the back surface of substrate 110. Layer may be formed from hafnium oxide (as an example). ARC layer 120 may serve to ensure that light entering substrate 110 from the back side is not reflected back towards the direction from which it arrived. A first dielectric layer 122 (e.g., a first oxide layer) may be formed over layer 120. A first passivation layer 130 may be formed on the first dielectric layer 122. A second dielectric layer (e.g., a second oxide layer) may be formed on the first passivation layer 130. A second passivation layer 134 may be formed on the second dielectric layer 132. Passivation layers 130 and 134 may be formed from nitride material (as an example).

Still referring to FIG. 3, color filter elements 117 may be formed in the active portion of image sensor die 102. In the example of FIG. 3, color filter element such as red color filter element 117R, green color filter element 117G, and blue color filter element 117B are formed in slots within a color filter housing structure (i.e., a color filter array housing structure having walls that are formed from the same dielectric material in layer 132 and that serve to provide improved light guiding capabilities for directing light to desired image sensor pixels). This arrangement in which color filter elements are secured within a color filter housing structure is sometimes referred to as a CFA-in-a-box (abbreviated as "CIAB"). The use and sequence of color filter elements 117R, 117G, and 117B are merely illustrative. If desired, other types of color filter elements such as cyan color filter elements, magenta color filter elements, yellow color filter elements, black color filter elements, clear color filter elements, and infrared filter elements can be used.

As shown in FIG. 3, inter-die via structures such as via structures 204 may traverse through at least a portion of die 102 and die 104. Via structures 204 may serve to connect circuitry within die 102 to circuitry within die 104. For example, vias 204 may connect metal routing structures 114 in dielectric stack 112 of die 102 to corresponding metal routing structures 108 in a dielectric stack 106 within die 104. Vias 204 may be formed through the oxide material in layers 132, 122, 112, and 106 and may therefore sometimes be referred to herein as through-oxide vias (TOVs). Vias 204 may also be formed through STI structures 118 at the front surface of substrate 110.

In the example of FIG. 3, the TOV structures 204 may be constructed during the formation of dielectric layer 132. For example, after passivation layer 130 has been formed on dielectric layer 122, a first hole can be formed through layers 130, 122, 120, and substrate 110. Thereafter, oxide material 132 may be deposited on top of layer 130 and may coat the sidewall and bottom of the first hole (see, oxide liner 206 of TOV 204). Once the oxide material for layer 132 has been formed, a second hole that is smaller than the first hole can be formed through the center of the first hole through layer 132, layer 130, layer 122, substrate 110, layers 112, and through at least a portion of the interconnect routing layers 106 in die 104.

Conductive material (e.g., copper, aluminum, tungsten, silver, gold, a combination of these materials, or other suitable conducting material) can then be deposited into the remaining hole to form TOV structure 204. In FIG. 3, sidewall liner 206 and layer 132 may represent the same dielectric layer.

In this arrangement, light shielding structures such as light shield structures 210 may be formed at the same time as TOV structure 204 (e.g., structures 204 and 210 may be formed simultaneously). In such arrangements, structures 204 and 210 may be formed in at least the same dielectric layer (e.g., in second oxide layer 132). Vias 204 may facilitate communication between die 102 and die 104. Light shield 210 may prevent light from reaching the reference photodiodes 116' or yet other structures in the peripheral/inactive portion of image sensor die 102.

Structures 204 and 210 may be formed from the same conductive and opaque material. In the example of FIG. 3, the walls of the color filter array housing structure are formed from the oxide material in layer 132. The CIAB oxide walls may therefore be formed at the same as the oxide material 206 lining TOVs 204. Formed in this way, the CFA housing structures (or CIAB structures) are sometimes referred to as being integrated with the through-oxide vias 204. Forming structures 204 and 210 in the same processing step and integrating the color filter housing structures with the TOV structures can help simplify process flow with fewer steps and fewer masks, can potentially help reduce stack height (i.e., the thickness of die 102) for better optical performance, and can also help provide a more uniform thickness across die 102 (i.e., to help ensure that the stack height in the active pixel imaging region is substantially similar to the stack height in the peripheral inactive region).

External bond pad structures such as external bond pad 200 is then formed on image sensor 102 (e.g., on layer 134). Bond pad 200 may be formed from aluminum, copper, silver, gold, a combination of these materials, or other suitable conductive materials. In particular, bond pad 200 may be coupled to through-oxide via structures 204 using additional vias or "plugs" 202 formed through layer 134. Plugs 202 may also be formed using the same material as bond pad 200. In general, bond pad 200 and TOV structures 204 may be formed from different materials. If desired, a thin adhesion and barrier layer such as a thin layer of tantalum nitride may be formed at the bottom of the bond pad structures to prevent the conductive material in the TOV structures from diffusing into electrically sensitive areas of the image sensor 102.

Still referring to FIG. 3, microlens structures such as microlens structures 212 may be formed on layer 134. In particular, an array of microlenses may be formed over image sensor 102, where each microlens in the array of microlenses serves to focus and direct light toward a corresponding photodiode 116 via one of the color filter elements 117. In general, microlenses 212 may be formed from some type of polymer, silicon, polysilicon, and/or other suitable types of transparent materials.

Once the CFA and microlens structures have been constructed, a final passivation layer such as passivation layer 214 may be formed over microlens structures 212 and bond pad 200. Passivation layer 214 may be formed using antireflective coating (ARC) material to prevent light entering microlenses 212 from being reflected back into the environment (as an example). Forming layer 214 over both structures 212 and 200 therefore serves dual purposes: (i) to serve as an antireflective liner on the array of microlenses and (ii) to serve as a passivation layer for bond pad 200. Using the microlens ARC liner 214 to passivate bond pad 200 can therefore eliminate a previous step that was required to passivate bond pad 200, thereby reducing processing steps and minimizing stack height during the CFA and microlens construction. Reducing the stack height during CFA and microlens formation is important because it reduces coat streaks and improves yield.

As shown in FIG. 3, a portion of layer 214 that is formed over bond pad 200 may be removed to expose bond pad 200. Bonding wire 84 may be coupled to the exposed portion of bond pad 200 using solder 85 or other conductive adhesive material. The exemplary configuration of FIG. 3 is merely illustrative and does not serve to limit the scope of the present invention. If desired, bond pad 200 may be coupled to other signal routing circuitry within die 102 and/or die 104.

Figure 4:
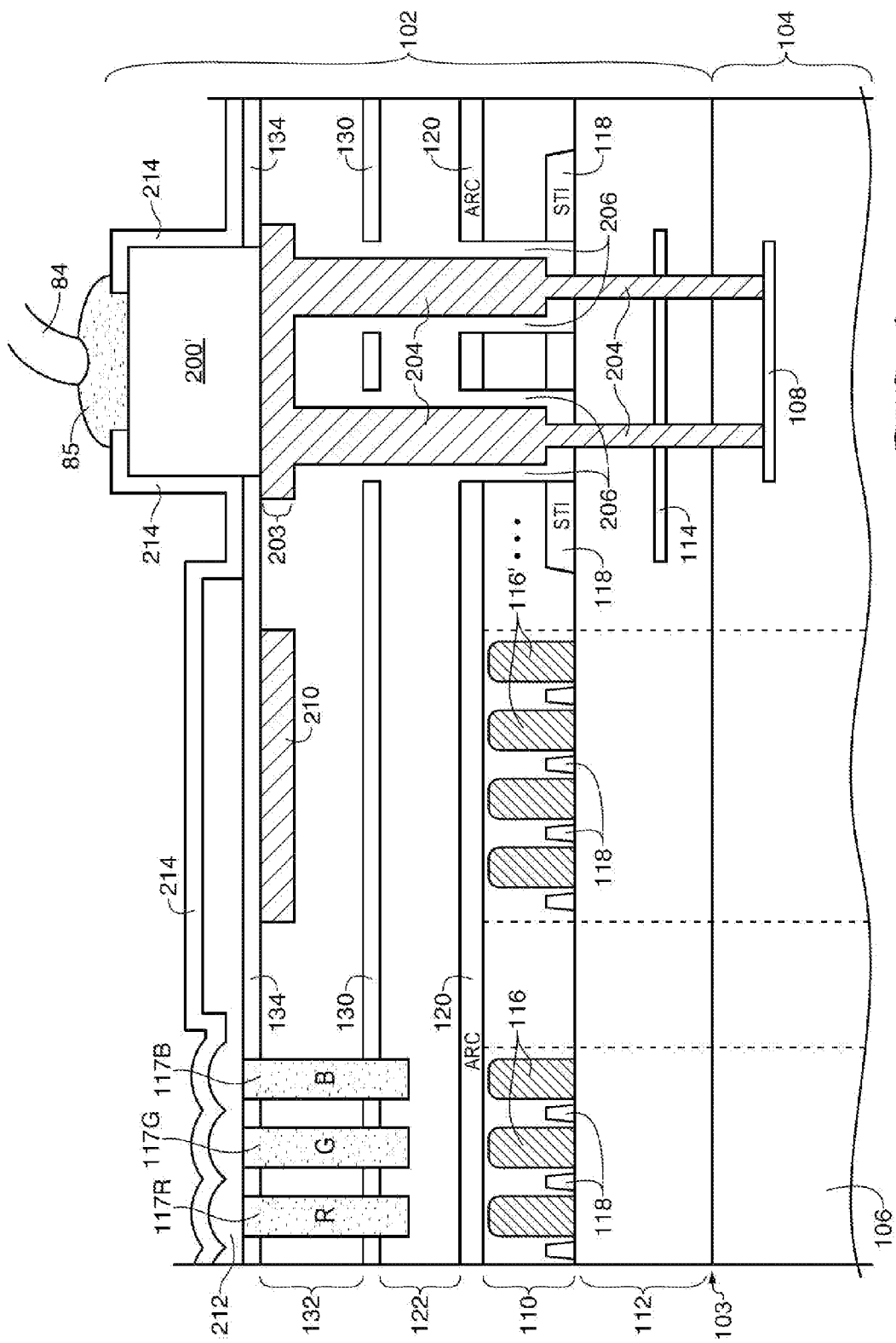
FIG. 4 is a cross-sectional side view of an illustrative imaging system having external bond pad structures formed directly on through-oxide via structures in accordance with an embodiment of the present invention.

FIG. 4 shows another suitable arrangement of a stacked die imaging system where the bond pad is formed directly on a patterned landing pad in topmost dielectric layer 132. As shown in FIG. 4, a conductive landing pad such as landing pad structure 203 may be constructed during formation of the through-oxide via structures 204. As an example, landing pad 203 may be formed by first patterning a rectangular trench in layer 132 and then filling the trench with conductive material. The landing pad trench may be formed when patterning a cavity for light shield structure 210 (as an example). The landing pad trench may be formed before forming the holes for the TOV structures or after forming the holes for the TOV structures. The landing pad trench may be filled at the same time as the light shielding structures 210 and the TOV structures. In other words, structures 210, 204, and 203 may be filled with the same material (e.g., copper).

This process in which landing pad 203 is formed in conjunction with TOV structures 204 by etching out a trench prior to filling the TOV is sometimes referred to as the "dual damascene" process. The formation of a copper landing pad (as an example) allows for bond pad 200' to be directly formed on top of the copper landing pad 203 (i.e., the additional bond pad plugs 202 in FIG. 4 need not be used). Manufacturing bond pad structures 200' directly on metal landing pad structures 203 without any intervening plugs can therefore also help reduce stack height.

Figure 5:
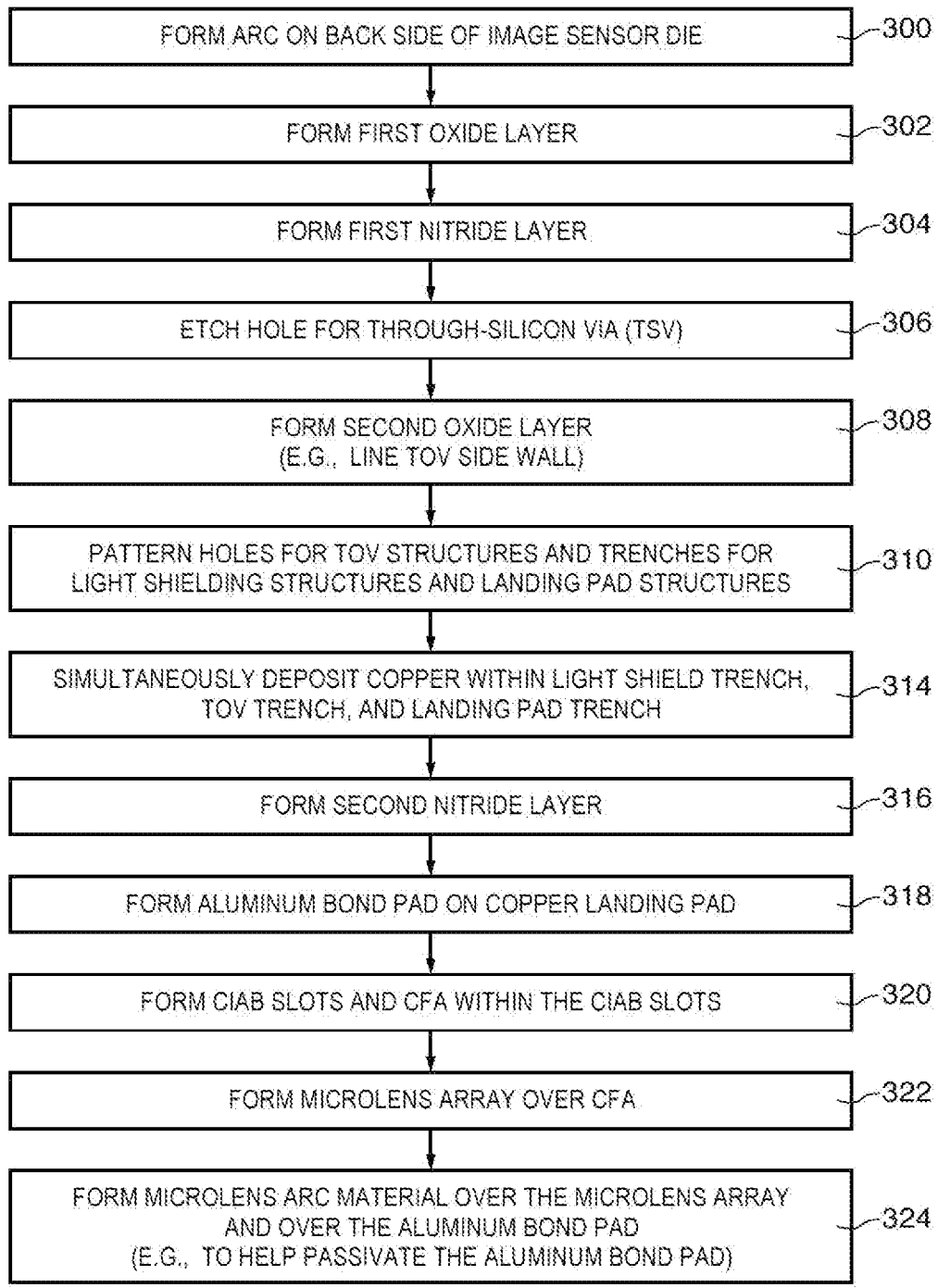
FIG. 5 is a flow chart of illustrative steps involved in forming an imaging system of the type shown in FIGS. 2-4 in accordance with an embodiment of the present invention.

FIG. 5 is a flow chart of illustrative steps for manufacturing an imaging system of the type described in connection with FIG. 4. At step 300, ARC liner 120 may be formed on the back side of image sensor substrate 110. Prior to step 300, photodiodes, shallow trench isolation structures, and other imaging circuitry may have already been formed at the front surface of image sensor substrate 100.

At step 302, first oxide layer 122 may be formed on ARC liner 120. At step 304, first passivation layer 130 (e.g., a first nitride layer) may be formed on layer 122. At step 306, a first hole may be etched through layers 130, 122, 120, and substrate 110. At step 308, oxide material may be deposited on top of layer 130 to form second oxide layer 132 and to also coat the sidewall and bottom of the first hole.

At step 310, additional areas on layer 132 may be patterned to form recesses for TOV structures, light shielding structures 210, and landing pad 203. For example, at least an additional second hole may be formed through the center of the first hole and may extend into DSP die 104 while cavities for the landing pad and the light shielding structures may be etched out. During step 314, these holes and cavities may be simultaneously filled with opaque, conductive material (e.g., copper) to form structures 210, 204, and 203 (see, e.g., FIG. 4).

At step 316, a second passivation layer (e.g., a second nitride liner) may be formed on the second oxide layer 132. At step 318, external bond pad structures such as bond pad 200' (e.g., an aluminum bond pad structure) may be formed directly on landing pad 203 (e.g., a copper landing pad structure). At step 320, color filter elements may be formed within respective slots in the CFA housing structures, where each color filter element is positioned over a corresponding photodiode in the active imaging region of die 102.

At step 322, microlens array 212 may be formed on second passivation layer 134 over the color filter array. At step 324, microlens ARC liner 214 may be simultaneously formed over the microlens array and the aluminum bond pad 200' to help passivate the bond pad structures.

These steps are merely illustrative and do not serve to limit the scope of the present invention. If desired, the order of these steps may be changed and additional processing steps can be inserted without departing from the spirit of the invention.

Figure 6:
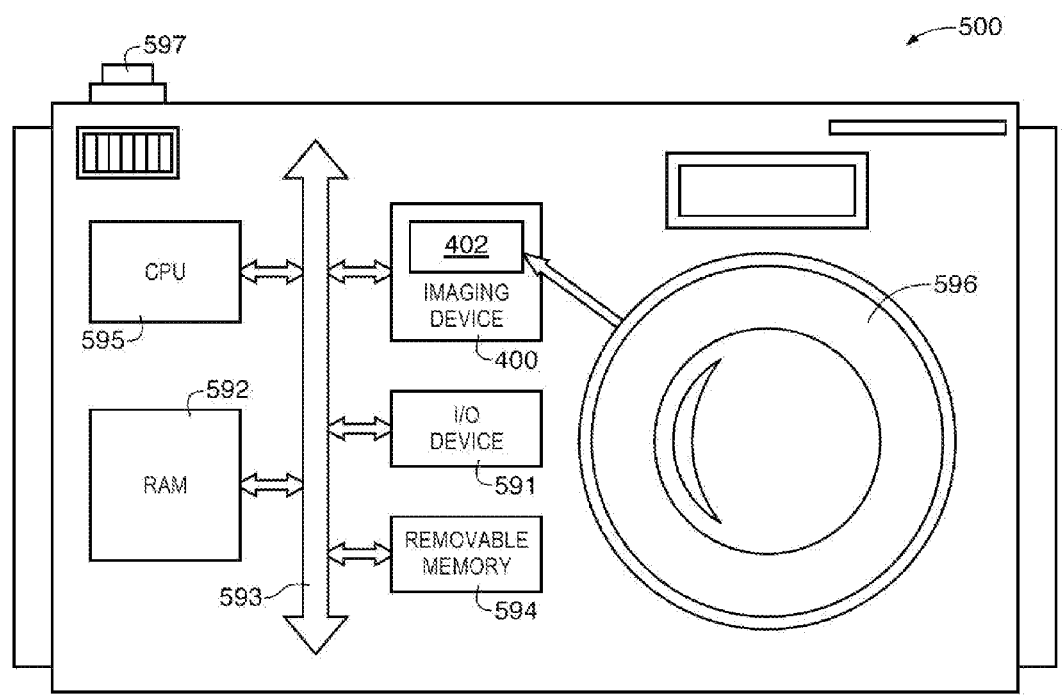
FIG. 6 is a block diagram of a system employing at least some of the embodiments of FIGS. 1-6 in accordance with an embodiment of the present invention.

FIG. 6 shows in simplified form a typical processor system 500, such as a digital camera, which includes an imaging device 400. Imaging device 400 may include a pixel array 402 having pixels of the type shown in FIG. 1 (e.g., pixel array 402 may be an array of image pixels formed on an image sensor SOC). Processor system 500 is exemplary of a system having digital circuits that may include imaging device 400. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 500, which may be a digital still or video camera system, may include a lens such as lens 596 for focusing an image onto a pixel array such as pixel array 30 when shutter release button 597 is pressed. Processor system 500 may include a central processing unit such as central processing unit (CPU) 595. CPU 595 may be a microprocessor that controls camera functions and one or more image flow functions and communicates with one or more input/output (I/O) devices 591 over a bus such as bus 593. Imaging device 400 may also communicate with CPU 595 over bus 593. System 500 may include random access memory (RAM) 592 and removable memory 594. Removable memory 594 may include flash memory that communicates with CPU 595 over bus 593. Imaging device 400 may be combined with CPU 595, with or without memory storage, on a single integrated circuit or on a different chip. Although bus 593 is illustrated as a single bus, it may be one or more buses or bridges or other communication paths used to interconnect the system components.

Various embodiments have been described illustrating an electronic device (see, e.g., device 10 of FIG. 1) that includes an imaging system and host subsystems. An imaging system may include one or more image sensors. Each image sensor may include an array of image pixels formed on a semiconductor substrate. Each image pixel may include one or more photosensitive elements configured to convert incoming light into electric charges.

In particular, imaging circuitry may include an image sensor die stacked on top of a digital signal processor (DSP) die. The image sensor die may include a substrate having front and back surfaces, a plurality of imaging pixels and shallow trench isolation (STI) structures formed in the front surface of the substrate, interconnect routing layers formed on the front surface of the substrate, a layer of antireflective coating (ARC) material formed on the back surface of the substrate, a first dielectric layer formed on the ARC layer, a first passivation layer formed on the first dielectric layer, a second dielectric layer formed on the first passivation layer, and a second passivation layer formed on the second dielectric layer. The first and second dielectric layers may be formed from oxide, whereas the first and second passivation layers may be formed from nitride (as examples).

In one suitable arrangement, an array of microlenses may be formed on the second passivation layer, whereas a through-oxide via (TOV) structure may be formed through the first dielectric layer, the second dielectric layer, the substrate, and the interconnect routing layers, and may extend partly into the DSP die. A TOV formed in this way may serve to convey image pixel signals from the image sensor die to the DSP die.

An external bond pad may be formed on the image sensor die over the TOV structure. The external bond pad may be electrically coupled to the TOV structure. A third passivation layer may be formed directly on the array of microlenses and the bond pad. The third passivation layer may be formed using antireflective coating (ARC) material. If desired, a landing pad structure may be interposed between the bond pad and the TOV structure. The landing pad structure may be formed in the second dielectric layer. The image sensor die may also include light shielding structures that are formed in the second dielectric layer. The landing pad structure, the light shielding structures, and the TOV structure may be formed at the same time (e.g., these structures may be simultaneously filled with the same conductive material). Manufactured in this way, the image sensor die may exhibit reduced stack height.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. Imaging circuitry, comprising:
   an image sensor die that includes:
      a substrate;
      a plurality of photosensitive elements formed in the substrate;
      a plurality of microlenses formed over the photosensitive elements;
      an external bond pad structure;
      a dielectric layer interposed between the substrate and the external bond pad structure; and
      a passivation layer that is formed directly on the plurality of microlenses and directly on the external bond pad structure.

2. The imaging circuitry defined in claim 1, further comprising:
   a digital signal processor die, wherein the image sensor die is stacked on top of the digital signal processor die.

3. The imaging circuitry defined in claim 2, wherein the passivation layer comprises antireflective coating (ARC) material.

4. The imaging circuitry defined in claim 2, wherein the image sensor die further includes:
   a through-oxide via structure that extends at least partially into the digital signal processor die and that is electrically coupled to the external bond pad structure.

5. The imaging circuitry defined in claim 4, wherein the through-oxide via structure and the external bond pad structure are formed from different conductive materials.

6. The imaging circuitry defined in claim 4, wherein the image sensor die further includes:
   a conductive landing pad structure interposed between the external bond pad structure and the through-oxide via.

7. The imaging circuitry defined in claim 6, wherein the image sensor die further includes:
   a light shielding structure, wherein the light shielding structure, the conductive landing pad structure, and the through-oxide via are formed at the same time.

8. A method of manufacturing an imaging system, comprising:
   forming an image sensor die by:
      forming a plurality of photodiodes in a substrate;
      forming a microlens array over the photodiodes;
      forming an external bond pad structure over the substrate;
      stacking the image sensor die on a digital signal processor;
      forming a through-oxide via that extends at least partially into the digital signal processor die; and
      forming a light shielding structure over the substrate at the same time as forming the through-oxide via.

9. The method as defined in claim 8, further comprising:
   depositing antireflective coating (ARC) material directly on the microlens array and on the external bond pad structure.

10. The method as defined in claim 8, wherein forming the image sensor further comprises:
    forming a dielectric layer over the substrate, wherein the through-oxide via is formed through at least the dielectric layer.

11. The method defined in claim 10, wherein forming the image sensor further comprises:
    forming a landing pad structure in the dielectric layer, wherein the landing pad structure is coupled to the through-oxide via.

12. The method defined in claim 11, wherein forming the landing pad structure and the through-oxide via comprises forming the landing pad structure and the through-oxide via using a dual damascene process, and wherein the external bond pad structure is formed directly on the landing pad structure.

13. A system, comprising:
a signal processing unit;
memory;
a lens;
input-output circuitry; and
an imaging device that is stacked on the signal processing unit, wherein the imaging device comprises:
  a substrate having a front surface and a back surface;
  a plurality of imaging pixels formed in the front surface of the substrate;
  a bond pad formed over the back surface of the substrate;
  a color filter array formed over the back surface of the substrate; and
  a through-oxide via having a liner, wherein the color filter array includes a plurality of color filter elements formed within a color filter housing structure, and wherein the color filter housing structure has walls that are integral with the liner of the through-oxide via.

14. The system defined in claim 13, wherein the imaging device further comprises:
  a conductive landing pad structure that is interposed between the bond pad and the through-oxide via.

15. The system defined in claim 14, wherein the imaging device further comprises:
  an array of microlenses formed over the imaging pixels and over the back surface of the substrate; and
  a dielectric layer formed between the back surface of the substrate and the array of microlenses, wherein the conductive landing pad structure and at least a portion of the through-oxide via is formed in the dielectric layer.

16. The system defined in claim 15, wherein the imaging device further comprises:
  a light shielding structure formed in the dielectric layer, wherein the light shielding structure, the conductive landing pad structure, and the through-oxide via are formed at the same time.

* * * * *